United States Patent [19]
Hata

[11] Patent Number: 5,780,876
[45] Date of Patent: Jul. 14, 1998

[54] COMPOUND SEMICONDUCTOR LIGHT EMITTING DEVICE AND MANUFACTURING METHOD THEREOF

[75] Inventor: Toshio Hata, Nara, Japan

[73] Assignee: Sharp Kabushiki Kaisha, Osaka, Japan

[21] Appl. No.: 635,648

[22] Filed: Apr. 22, 1996

[30] Foreign Application Priority Data

Apr. 24, 1995 [JP] Japan .................. 7-098633

[51] Int. Cl.$^6$ .................. H01L 29/205; H01L 33/00
[52] U.S. Cl. .................. 257/103; 257/85; 257/97; 372/45; 372/46; 372/50
[58] Field of Search .................. 257/85, 97, 103; 437/23, 129, 133; 372/45, 46, 50

[56] References Cited

U.S. PATENT DOCUMENTS

| | | | |
|---|---|---|---|
| 4,728,628 | 3/1988 | Fiddyment | 437/129 |
| 5,495,115 | 2/1996 | Kudo | 372/45 |
| 5,557,115 | 9/1996 | Shakuda | 257/97 |
| 5,583,878 | 12/1996 | Shimizu | 372/45 |
| 5,583,879 | 12/1996 | Yamazaki | 257/103 |
| 5,592,501 | 1/1997 | Edmond | 372/45 |

OTHER PUBLICATIONS

Nakamura, S., et al., "Candela–class high–brightness InGaN/AlGaN double–heterostructure blue–light–emitting diodes" *Applied Physics Letters* (28 Mar. 1994) 64(13):1687–1689.

*Primary Examiner*—Jerome Jackson
*Attorney, Agent, or Firm*—Morrison & Foerster LLP

[57] ABSTRACT

After the active layer including indium is formed, the evaporation preventing layer is formed at a temperature which does not cause liberation of indium. The p-type $Al_xGa_{1-x}N$ ($0 \leq X \leq 1$) or the like is used for the evaporation preventing layer. Increasing the substrate temperature to as high as 1020° C. for forming the upper cladding layer does not cause liberation of indium from the active layer because the evaporation preventing layer is provided. As a result, the composition ratio of indium can be easily controlled and the high-quality active layer and the high-quality interface between the active layer and the upper cladding layer can be provided.

5 Claims, 8 Drawing Sheets

SCHEMATIC DIAGRAM IN THE PROXIMATE REGION OF THE ACTIVE LAYER

COMPOUND SEMICONDUCTOR LIGHT EMITTING DEVICE AND MANUFACTURING METHOD THEREOF

BACKGROUND OF THE INVENTION

1. Field of the Invention

The present invention relates to compound semiconductor light emitting devices and manufacturing methods thereof and, more particularly, to a semiconductor laser diode and a light emitting diode capable of emitting blue light.

2. Description of the Background Art

FIG. 17 schematically shows a cross sectional structure of a conventional AlGaN/InGaN/AlGaN type compound semiconductor light emitting device (semiconductor laser, light emitting diode) capable of emitting blue light.

Referring to FIG. 17, the semiconductor light emitting device includes a sapphire (0001) substrate 1, a GaN or AlN buffer layer 2, an n-type GaN layer 3, n-type $Al_zGa_{1-z}N$ ($0 \leq Z \leq 1$) lower cladding layer 4, a non-doped or Zn-doped $In_yGa_{1-y}N$ ($0 \leq Y \leq 1$) active layer (or referred to as a light emitting layer) 5, a p-type $Al_zGa_{1-z}N$ ($0 \leq Z \leq 1$) upper cladding layer 7, and a p-type GaN cap layer 8, stacked on sapphire (0001) substrate 1 in this order. An n-type electrode 10 and a p-type electrode 9 are formed at n-type GaN layer 3 and p-type GaN cap layer 8, respectively.

Such compound semiconductor light emitting device is generally manufactured through the steps below by metal organic chemical vapor deposition method (hereinafter referred to as "MOCVD method").

(1) A surface of sapphire substrate 1 is processed at the temperature of approximately 1050° C.

(2) The substrate temperature is lowered to approximately 510° C. to grow thin GaN or AlN buffer layer 2.

(3) The substrate temperature is elevated to 1020° C. to grow n-type GaN layer 3.

(4) The n-type AlGaN lower cladding layer 4 is grown at the same temperature.

(5) The substrate temperature is lowered to approximately 800° C. to grow non-doped InGaN type active layer (or Zn-doped light emitting layer) 5 to have a thickness of approximately 100–500 Å.

(6) The substrate temperature is increased to approximately 1020° C. to grow p-type AlGaN upper cladding layer 7.

(7) The p-type GaN cap layer 8 is grown at the same temperature.

(8) After etching, p-type electrode 9 and n-type electrode 10 are formed.

In the steps above, active layer 5 including indium is grown at the temperature of approximately 800° C. because a desired indium ratio cannot be obtained at a growth temperature of 1000° C. or higher since the vapor pressure of indium is relatively high. In addition, AlGaN cladding layer 7 is grown at 1020° C. because the layer cannot have high quality crystal unless it is grown at a temperature of 1000° C. or higher.

Therefore, in the steps (4)–(6) above the light emitting device goes through the growth temperature profile shown in FIG. 16. In FIG. 16, the horizontal axis shows the growth direction of the semiconductor and the vertical axis shows the growth temperature.

However, the conventional method of manufacturing compound semiconductor device described above has a problem that, when the substrate temperature is increased to approximately 1020° C. to grow p-type AlGaN upper cladding layer 7, indium liberates from active layer (light emitting layer) 5 including indium formed at the previous step. Such liberation of indium leads to degradation of the interface between active layer 5 and upper cladding layer 7 and makes it difficult to control the mixed crystal ratio of indium and the thickness of active layer 5.

SUMMARY OF THE INVENTION

Therefore, an object of the present invention is to provide a compound semiconductor light emitting device which prevents liberation of indium.

Another object of the present invention is to suppress the liberation of indium to the least possible amount, allow crystal growth with high controllability, and manufacture a high-quality active layer including indium and provide a high-quality interface of the active layer, in the steps of manufacturing a compound semiconductor light emitting device.

According to one aspect of the present invention, a compound semiconductor light emitting device includes a substrate, a lower cladding layer formed on the substrate, an active layer including indium formed on the lower cladding layer, an evaporation preventing layer formed on the active layer, and an upper cladding layer formed on the evaporation preventing layer.

According to another aspect of the present invention, a method of manufacturing a compound semiconductor light emitting device includes a first step of forming a lower cladding layer, a second step of forming an active layer constituted by $Al_xGa_yIn_zN$ ($X+Y+Z=1$ and $0 \leq X \cdot Y \leq 1$, $0 < Z \leq 1$) on the lower cladding layer at a first temperature, and a third step of forming an evaporation preventing layer constituted by $Al_xGa_{1-x}N$ ($0 \leq X \leq 1$) on the active layer at a second temperature equal to or lower than the first temperature.

According to the present invention, the compound semiconductor light emitting device is provided with the evaporation preventing layer so as to suppress liberation of indium to the least possible amount, allow crystal growth with high controllability, and include a high-quality active layer (light emitting layer) containing indium and a high-quality interface of the active layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter. The embodiments do not limit the growth conditions, the kinds of organometallic compound gases, and the material used, to those described hereinafter. Various changes can be made to the embodiments within the scope of the appended claims.

First Embodiment

In the first embodiment, sapphire with (0001) orientation (c-face) is used as a substrate, and respective layers are grown by MOCVD method. Trimethylgallium (TMG), trimethylaluminum (TMA) and trimethylindium (TMI) are used as the group III source gases, and ammonia ($NH_3$) is used as the group V source gas. Monosilane ($SiH_4$) and biscyclo-pentadienyl-magnesium ($Cp_2Mg$) are used as n-type and p-type dopant sources, respectively. As carrier gas, $H_2$ is used.

Figure 1:
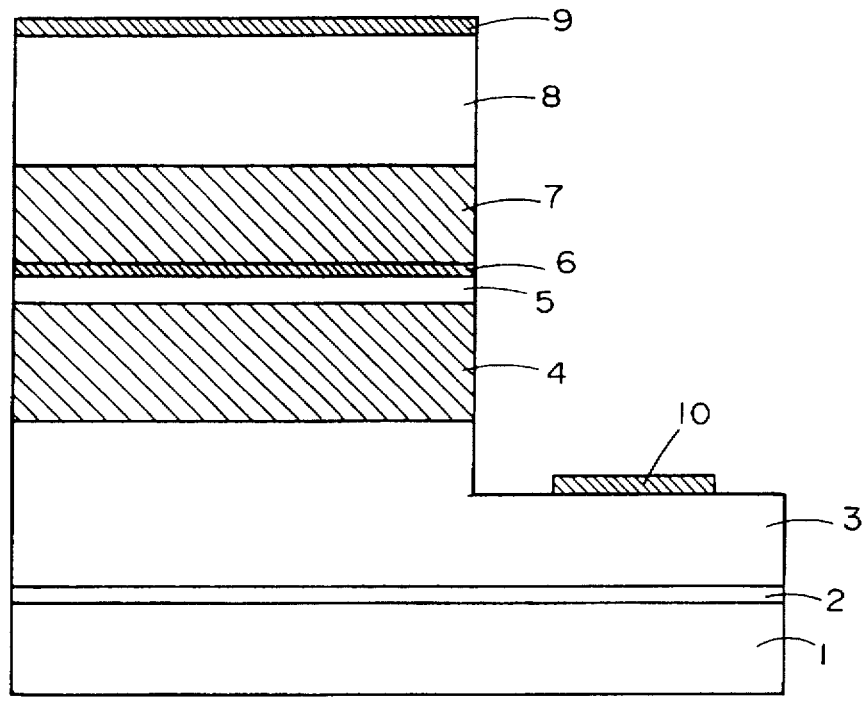
FIG. 1 is a cross sectional view schematically showing a semiconductor laser diode according to a first embodiment of the present invention.

FIG. 1 is a cross sectional view schematically showing a semiconductor laser diode according to the first embodiment of the present invention.

Referring to FIG. 1, the semiconductor laser diode according to the present embodiment includes a sapphire substrate 1, a GaN or AlN buffer layer 2, an n-type GaN layer 3, an n-type $Al_{0.1}Ga_{0.9}N$ lower cladding layer 4, a non-doped or Si-doped $In_{0.2}Ga_{0.8}N$ active layer (or referred to as a light emitting layer) 5, a thin p-type layer 6 of $Al_{0.05}Ga_{0.95}N$ for preventing evaporation, a p-type $Al_{0.1}Ga_{0.9}N$ upper cladding layer 7, and a p-type GaN cap layer 8, stacked on sapphire (0001) c-face substrate 1 in this order. In addition, an n-type electrode 10 and a p-type electrode 9 are formed at n-type GaN layer 3 and p-type GaN cap layer 8, respectively.

Figure 17:
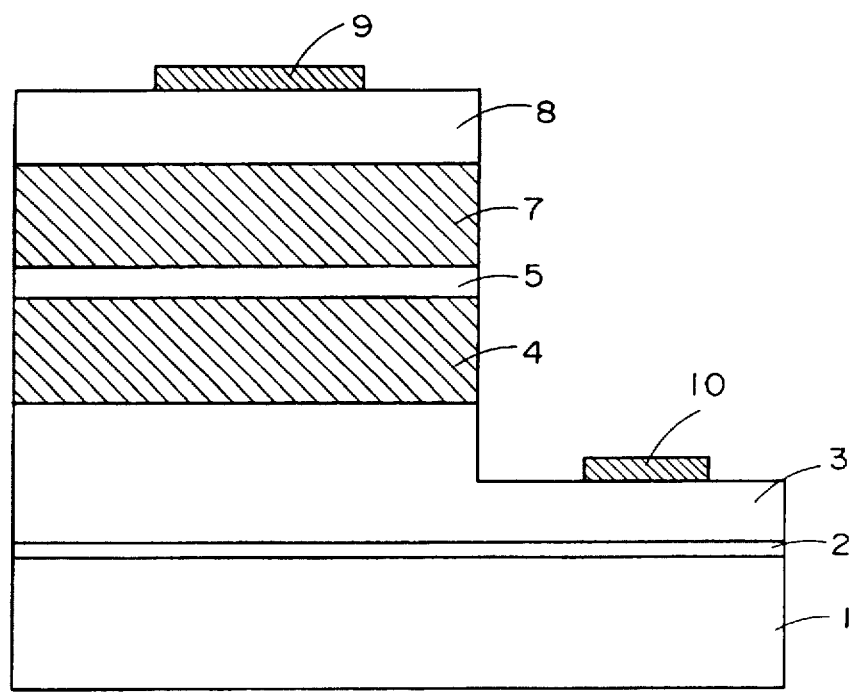
FIG. 17 is a cross sectional view schematically showing the conventional compound semiconductor light emitting device.

This structure of the stacked semiconductor layers is different from the conventional one shown in FIG. 17 in that evaporation preventing layer 6 is provided between active layer 5 and upper cladding layer 7.

The semiconductor laser shown in FIG. 1 is formed by the steps below.

(1) Sapphire substrate 1 is introduced into an MOCVD system, heated in $H_2$ at the substrate temperature of approximately 1050° C. to process the surface thereof.

(2) The substrate temperature is lowered to approximately 500° C. to grow GaN or AlN buffer layer 2. Here, the thickness of buffer layer 2 is desirably 250 Å if it is formed of GaN, or 500 Å if it is formed of AlN.

Figure 3:
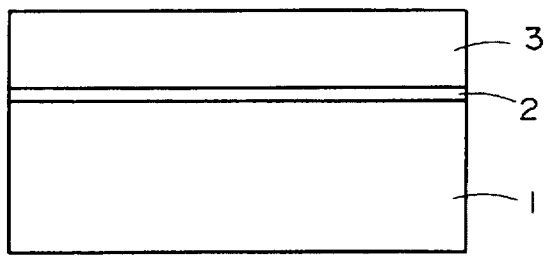
FIGS. 3–7 show manufacturing steps of the compound semiconductor light emitting device.

(3) The substrate temperature is increased to approximately 1020° C., so that n-type GaN layer 3 is grown to have a thickness of approximately 4 μm. The structure of the stacked layers shown in FIG. 3 is obtained at this stage.

Figure 4:
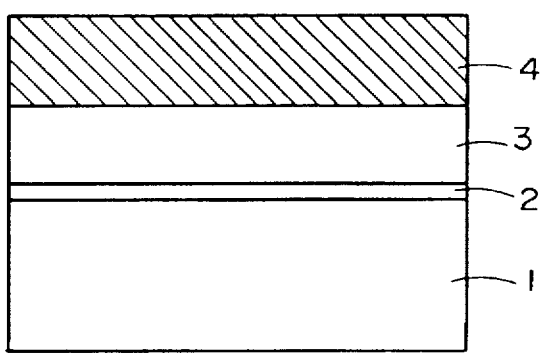

(4) The n-type $Al_{0.1}Ga_{0.9}N$ lower cladding layer 4 is grown to have a thickness of approximately 1 μm at the same substrate temperature. The structure of the stacked layers on the substrate obtained at this stage is shown in FIG. 4.

Figure 5:
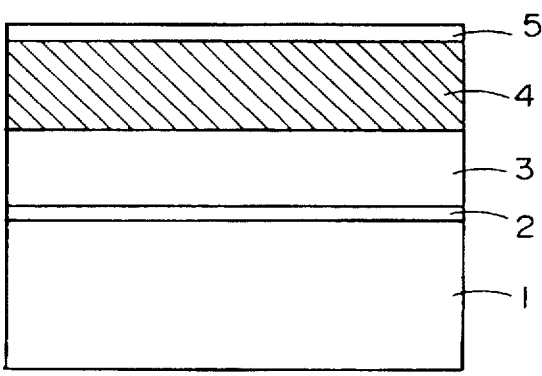

(5) The substrate temperature is lowered to approximately 800° C. to grow the non-doped or Si-doped $In_{0.2}Ga_{0.8}N$ active layer to a thickness of approximately 200 Å. The structure of the stacked layers obtained at this stage is shown in FIG. 5.

Figure 6:
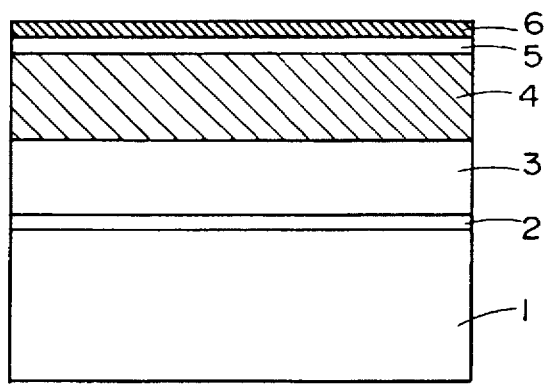

(6) The substrate temperature is decreased to be equal to or lower than the growth temperature of the non-doped or Si-doped $In_{0.2}Ga_{0.8}N$ active layer and grow thin p-type layer 6 of $Al_{0.05}Ga_{0.95}N$ for preventing evaporation at the growth temperature of approximately 500°–800° C. The structure of the stacked layers obtained at this stage is shown in FIG. 6.

(7) The substrate temperature is increased to approximately 1020° C., so that p-type $Al_{0.1}Ga_{0.9}N$ upper cladding layer 7 is grown to have a thickness of approximately 1 μm.

Figure 7:
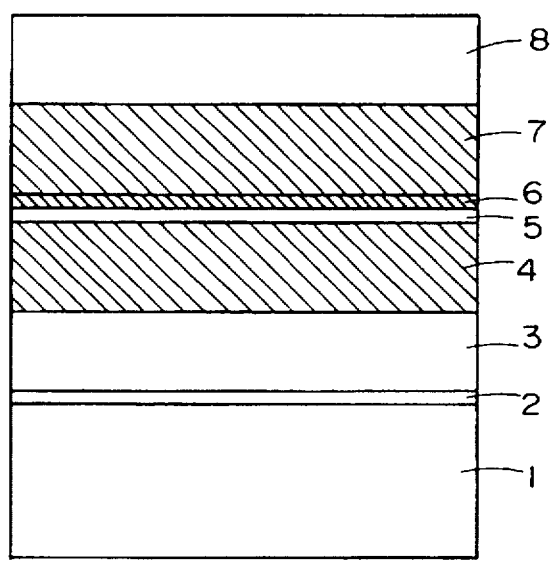

(8) At the same temperature, p-type GaN cap layer 8 is grown to a thickness of approximately 1 μm. The structure of the stacked layers at this stage is shown in FIG. 7.

The thin p-type layer 6 of $Al_{0.05}Ga_{0.95}N$ for preventing evaporation becomes a high-quality film while the substrate temperature is increased to approximately 1020° C.

The wafer manufactured through the steps above is subjected to $N_2$ ambient thermal annealing at the temperature of approximately 700° C. By such thermal annealing, evaporation preventing layer 6, p-type $Al_{0.1}Ga_{0.9}N$ upper cladding layer 7 and p-type GaN cap layer 8 change into high concentration p-type layers.

In order to provide the electrodes, a part of the wafer is etched until n-type GaN layer 3 is exposed. Thereafter, p-type and n-type electrodes 9 and 10 are formed. The AlGaN/InGaN/AlGaN type semiconductor laser diode shown in FIG. 1 is manufactured through the steps above.

Figure 2:
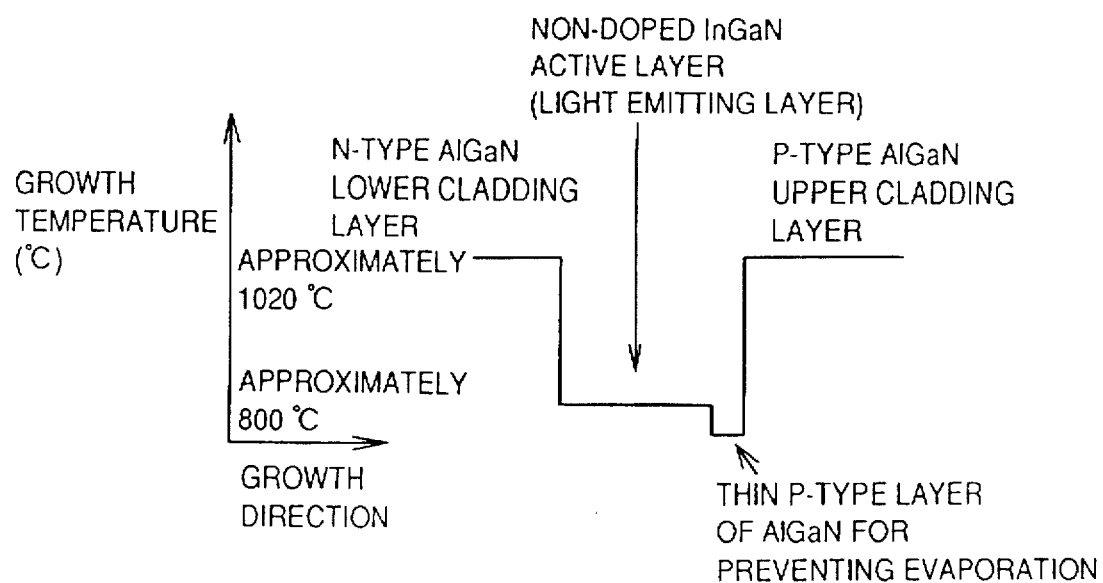
FIG. 2 shows a growth temperature profile of a compound semiconductor light emitting device in the first embodiment of the present invention.

FIG. 2 shows growth temperature profile of the crystal during formation of layers 4 through 7 of the semiconductor laser diode shown in FIG. 1.

Thus, in the compound semiconductor light emitting device according to the present embodiment, after active layer 5 is formed, evaporation preventing layer 6 is formed at a temperature equal to or lower than the growth temperature of active layer 5, and then upper cladding layer 7 is formed at the substrate temperature of approximately 1020° C. As a result, liberation of indium included in active layer 5 is prevented, so that a compound semiconductor light emitting device having a high-quality active layer including indium and providing the high-quality interface of the active layer can be provided and crystal growth with high controllability can be achieved in the manufacturing process thereof.

Figure 8:
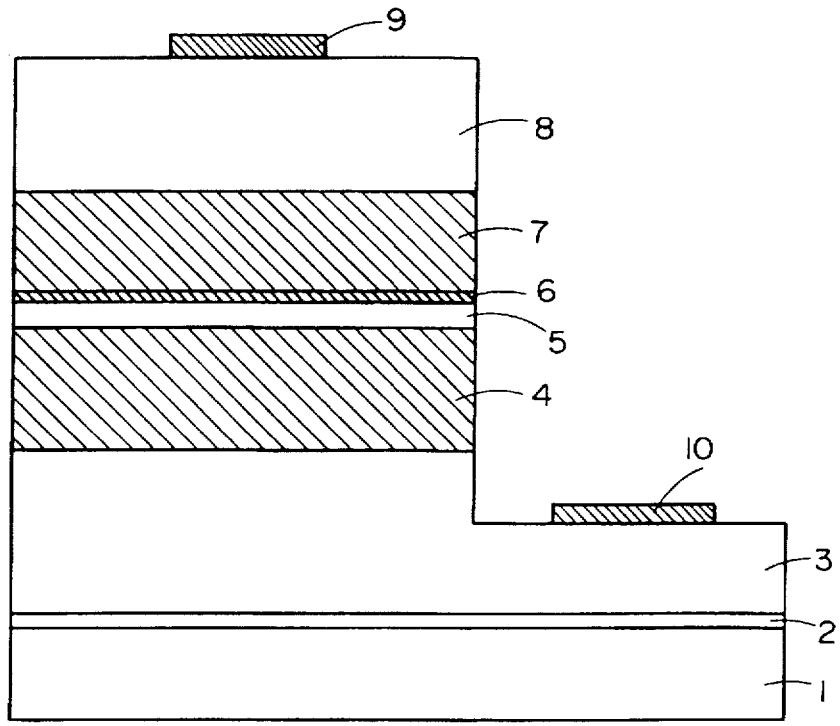
FIG. 8 is a cross sectional view schematically showing a light emitting diode according to a modification of the first embodiment of the present invention.

FIG. 8 is a cross sectional view schematically showing a light emitting diode according to a modification of the first embodiment of the present invention.

Referring to FIG. 8, a small p-type electrode 9 is formed in the light emitting diode in contrast to the semiconductor laser diode shown in FIG. 1, so that the light emitted by active layer 5 is output upward through upper cladding layer 7 and a cap layer 8.

Second Embodiment

Figure 9:
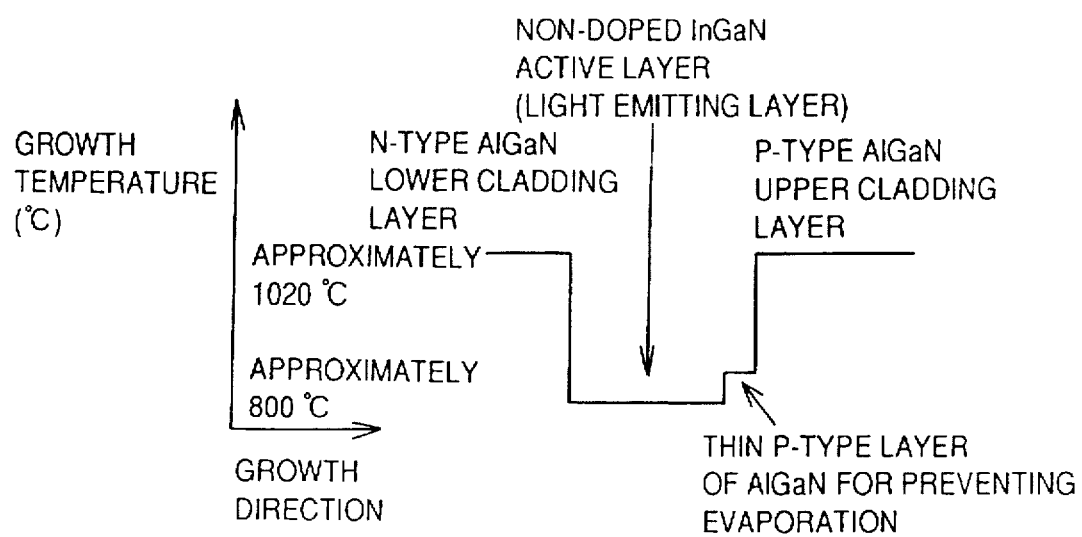
FIG. 9 shows a growth temperature profile of a compound semiconductor light emitting device according to a second embodiment of the present invention.

FIG. 9 is a diagram showing growth temperature profile of the lower cladding layer, the active layer, the evaporation preventing layer, and the upper cladding layer of the compound semiconductor light emitting device according to the second embodiment of the present invention.

The structure of the stacked layers of the compound semiconductor light emitting device according to the present embodiment is identical to that in the first embodiment shown in FIGS. 1 and 8, and description thereof will not be repeated. The compound semiconductor light emitting device in the second embodiment is characterized in that the evaporation preventing layer is formed at a substrate temperature which is equal to or higher than the growth temperature of the active layer including indium and equal to or lower than the growth temperature of the upper cladding layer.

The crystal is grown by MOCVD method and sapphire (0001) c-face is used as a substrate in the second embodiment. Trimethylgallium (TMG), trimethylaluminum (TMA) and trimethylindium (TMI) are used as the group III source gases, and ammonia ($NH_3$) is used as the group V source gas. Monosilane ($SiH_4$) is used as n-type dopant source, biscyclo-pentadienyl-magnesium ($Cp_2Mg$) is used as p-type dopant source, and $H_2$ is used as carrier gas. The manufacturing process will be described hereinafter.

(1) The sapphire substrate is introduced into an MOCVD system, and heated in $H_2$ at the substrate temperature of approximately 1050° C. for processing the surface thereof.

(2) The substrate temperature is lowered to approximately 500° C. to form the GaN or AlN buffer layer. The thickness of the buffer layer is 250 Å if it is formed of GaN, or 500 Å if formed of AlN.

(3) The substrate temperature is increased to approximately 1020° C. to form the n-type GaN layer to approximately 4 μm.

(4) At the same substrate temperature, n-type $Al_{0.1}Ga_{0.9}N$ lower cladding layer 4 is grown to approximately 1 μM.

(5) The substrate temperature is lowered to approximately 800° C. to grow the non-doped or Si-doped $In_{0.2}Ga_{0.8}N$ active layer (or referred to as a "light emitting layer") to have a thickness of approximately 200 Å.

(6) The thin p-type layer of $Al_{0.05}Ga_{0.95}N$ for preventing evaporation is grown at the substrate temperature of approximately 900° C. which is equal to or higher than the growth temperature of the non-doped or Sidoped $In_{0.2}Ga_{0.8}N$ active layer and is equal to or lower than the growth temperature of the p-type $Al_{0.1}Ga_{0.9}N$ upper cladding layer.

(7) The substrate temperature is increased to approximately 1020° C. to grow the p-type $Al_{0.1}Ga_{0.9}N$ upper cladding layer to approximately 1 μm.

(8) The p-type GaN cap layer is grown to approximately 1 μm. The thin p-type layer of $Al_{0.05}Ga_{0.95}N$ for preventing evaporation becomes a high-quality film while the substrate temperature is increased to approximately 1020° C.

After the crystal is grown, the wafer is subjected to thermal annealing and etching, followed by formation of the electrodes. These steps are identical to those in the first embodiment, and therefore the description thereof will not be repeated here.

As described above, according to the present embodiment, after the active layer including indium is formed, the evaporation preventing layer is formed at a temperature which is equal to or higher than the growth temperature of the active layer and is equal to or lower than the growth temperature of the upper cladding layer, so that liberation of indium is prevented and crystal growth with high controllability is possible, whereby a high-quality active layer including indium and therefore the interface of the active layer can be provided.

Third Embodiment

The structure of the stacked layers of a compound semiconductor light emitting device manufactured in accordance with the third embodiment is identical to that of the compound semiconductor light emitting device in the first embodiment shown in FIGS. 1 and 8, and therefore description thereof will not be repeated.

Figure 10:
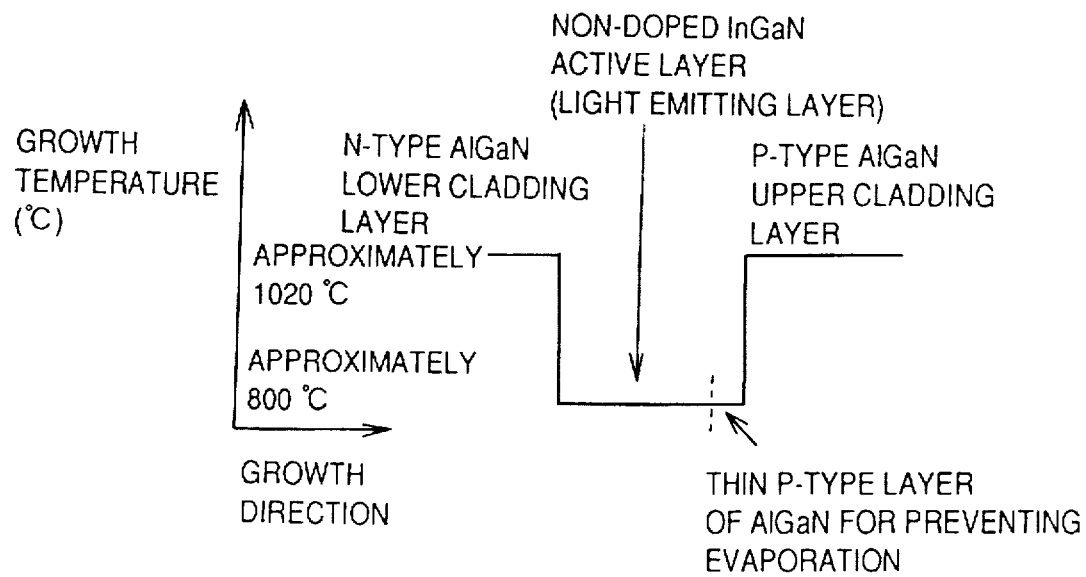
FIG. 10 shows a growth temperature profile of a compound semiconductor light emitting device according to a third embodiment of the present invention.

FIG. 10 shows temperature profile during formation of the lower cladding layer, the active layer, the evaporation preventing layer, the upper cladding layer of the compound semiconductor light emitting device according to the third embodiment of the present invention.

The step of manufacturing the compound semiconductor light emitting device according to the present embodiment is characterized in that the growth temperature of the evaporation preventing layer is set substantially equal to the growth temperature of the active layer including indium.

The compound semiconductor light emitting device according to the present embodiment is manufactured by MOCVD method. Sapphire (0001) c-face is used as a substrate. Trimethylgallium (TMG), trimethylalumium (TMA), and trimetylindium (TMI) are used as the group III source gases, and ammonia ($NH_3$) is used as the group V source gas. Monosilane ($SiH_4$) and biscyclo-pentadienyl-magnesium ($Cp_2Mg$) are used as n-type and p-type dopant sources, and $H_2$ is used as carrier gas. The manufacturing steps will be described below.

(1) The sapphire substrate is introduced into an MOCVD system and heated in $H_2$ at the substrate temperature of approximately 1050° C. to process the surface of the substrate.

(2) The substrate temperature is decreased to approximately 500° C. to grow the GaN or AlN buffer layer. The buffer layer has a thickness of 250 Å if it is formed of GaN, or 500 Å if it is formed of AlN.

(3) The substrate temperature is elevated to approximately 1020° C. to grow the n-type GaN layer to approximately 4 μm.

(4) At the same substrate temperature, the n-type $Al_{0.1}Ga_{0.9}N$ lower cladding layer is grown to approximately 1 μ

(5) The substrate temperature is lowered to approximately 800° C., so that the non-doped or Si-doped $In_{0.2}Ga_{0.8}N$ active layer is grown to have a thickness of approximately 200 Å.

(6) The thin p-type layer of $Al_{0.05}Ga_{0.95}N$ for preventing evaporation is grown at a growth temperature substantially equal to that of the non-doped or Si-doped $In_{0.2}Ga_{0.8}N$ active layer.

(7) The substrate temperature is increased to approximately 1020° C. to grow the p-type $Al_{0.1}Ga_{0.9}N$ upper cladding layer to approximately 1 μm.

(8) The p-type GaN cap layer is grown to approximately 1 μm. The thin p-type layer for preventing evaporation becomes a high-quality film as the substrate temperature is increased to approximately 1020° C.

The manufactured wafer undergoes the steps of thermal annealing, etching, and forming the electrodes and completed as such device as a semiconductor laser and a light emitting diode. Since these steps are substantially identical to those in the first embodiment, description thereof will not be repeated.

Fourth Embodiment

Figure 11:
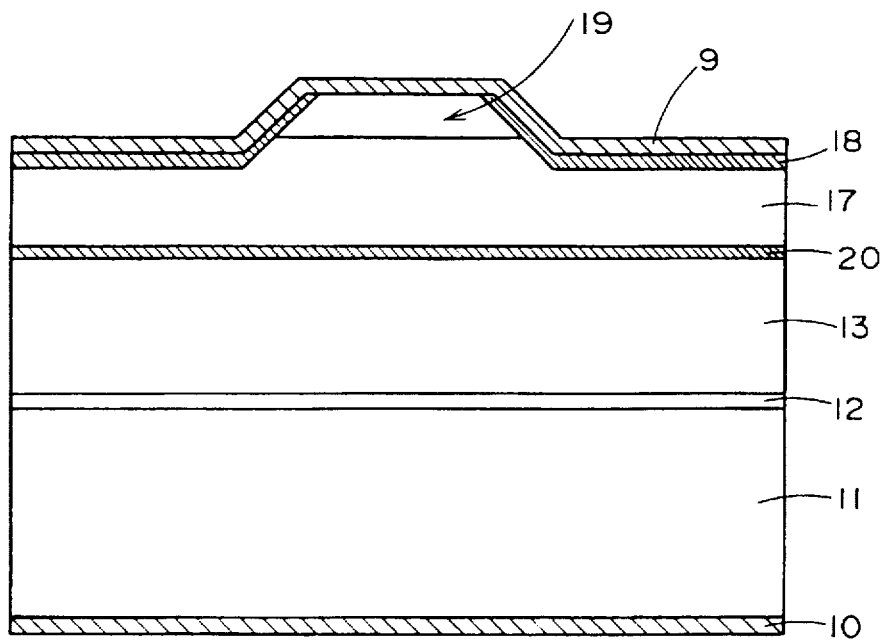
FIG. 11 is a cross sectional view schematically showing a semiconductor laser diode according to a fourth embodiment of the present invention.

FIG. 11 is a cross sectional view schematically showing a compound semiconductor light emitting device according to the fourth embodiment of the present invention.

Referring to FIG. 11, the compound semiconductor light emitting device according to the present embodiment includes n-type electrode 10, an n-type GaAs substrate 11, an n-type GaAs buffer layer 12, an n-type $Al_{0.8}Ga_{0.2}As$ lower cladding layer 13, an active layer 20, a p-type (Mg-doped) $Al_{0.8}Ga_{0.2}As$ upper cladding layer 17, an insulating layer 18, a p-type GaAs cap layer 19, and p-type electrode 9, stacked in this order. Active layer 20 includes a non-doped GaAs layer 14, a non-doped $In_{0.15}Ga_{0.85}As$ active layer 15 with strained layer quantum well and a non-doped GaAs evaporation preventing layer 16, stacked in this order from the bottom of the figure.

Figure 12:
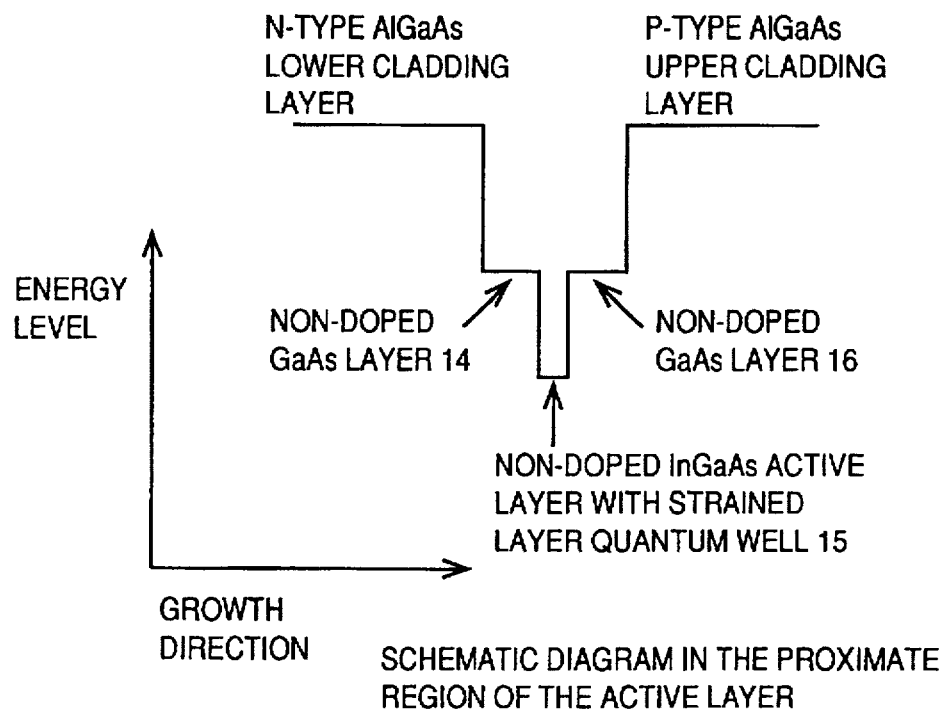
FIG. 12 shows energy level in the proximate region of an active layer shown in FIG. 11.

The energy level in the proximate region of the active layer is shown in FIG. 12. A Ridge waveguide structure having a width of 3 μm is formed by photolithography and wet etching at the compound semiconductor light emitting device according to the present embodiment.

The compound semiconductor light emitting device according to the present embodiment is formed by MOCVD method. In the present embodiment, GaAs is used as a substrate, trimethylgallium (TMG), trimethylaluminum (TMA) and trimethylindium (TMI) are used as the group III source gases, and arsine ($AsH_3$) is used as the group V source gas. Se is used as p-type dopant source, Mg and Zn are used as p-type dopant source, and $H_2$ is used as carrier gas. The compound semiconductor light emitting device according to the present embodiment is manufactured through the steps below.

(1) The n-type (100) GaAs substrate 11 is introduced into an MOCVD system, and the substrate temperature is increased to approximately 800° C. to grow GaAs buffer layer 12. The thickness of the n-type GaAs buffer layer is 0.5 μm.

(2) At the same temperature, n-type $Al_{0.8}Ga_{0.2}As$ lower cladding layer 13 is grown to have a thickness of approximately 1.4 pm.

(3) Non-doped type GaAs layer 14 is grown to approximately 100 Å.

(4) The substrate temperature is lowered to approximately 630° C. to grow non-doped $In_{0.5}Ga_{0.85}As$ active layer 15 with strained layer quantum well to have a thickness of approximately 110 Å.

Figure 13:
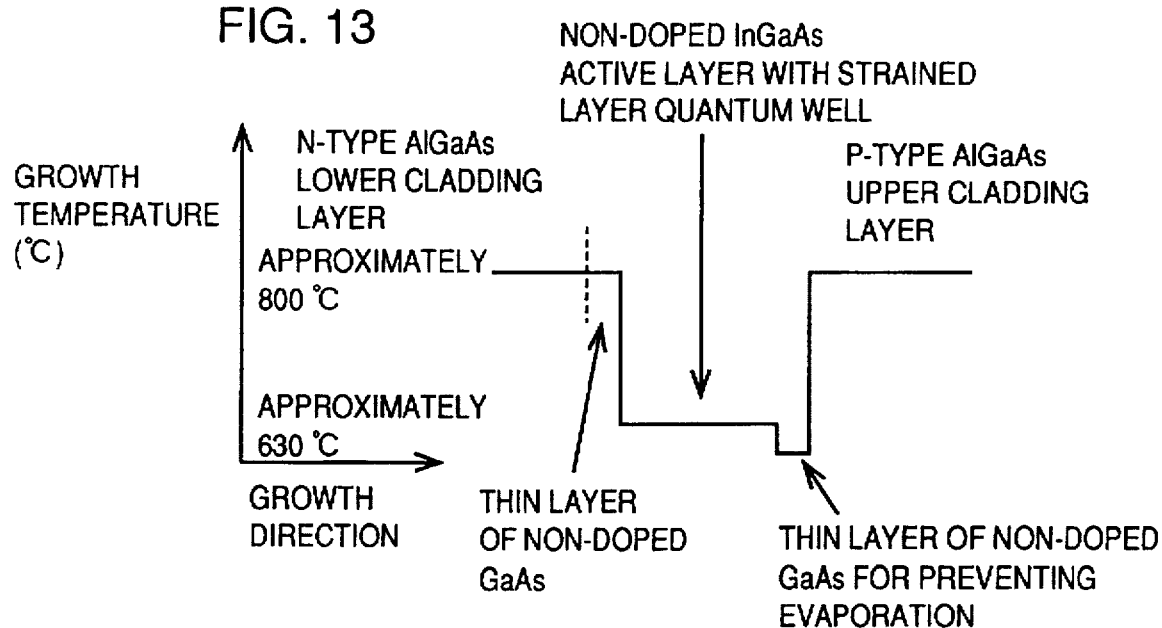
FIGS. 13–15 show temperature profiles in the process of manufacturing a laser diode shown in FIG. 11.
Figure 14:
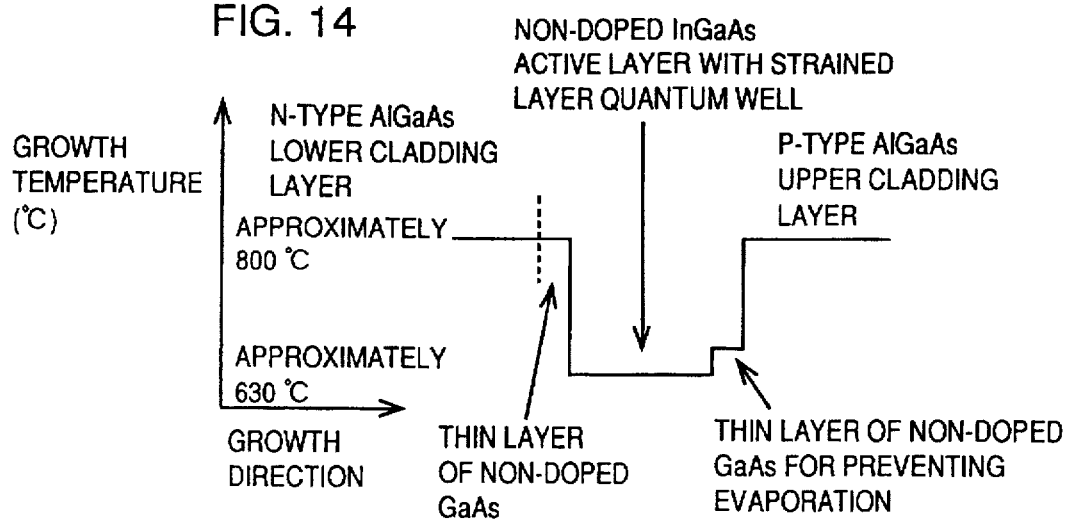
Figure 15:
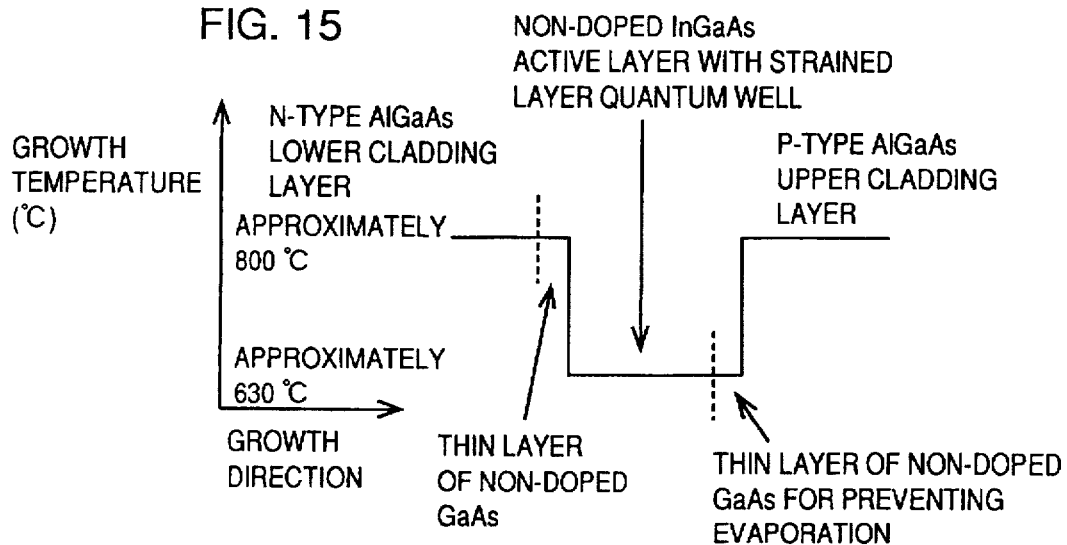
Figure 16:
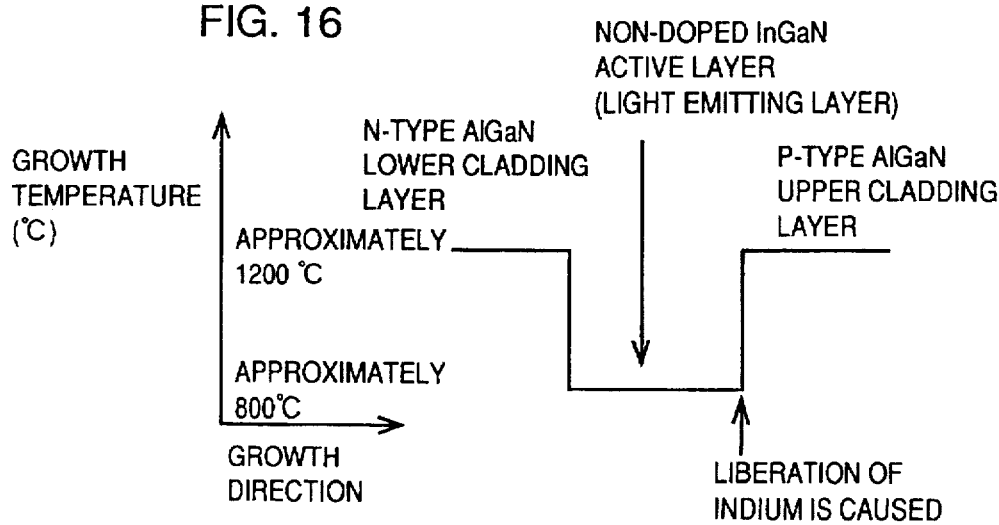
FIG. 16 shows a temperature profile in the steps of manufacturing a conventional compound semiconductor light emitting device.

(5) Non-doped type GaAs evaporation preventing layer 16 is grown to have a thickness of approximately 100 Å. In growth of the evaporation preventing layer, the temperature of the substrate can follow any of the growth temperature profiles shown in FIGS. 13 to 15. More specifically, in FIG. 13, the evaporation preventing layer is formed at approximately 550° C. which is lower than the growth temperature of 630° C. for the active layer with strained layer quantum well. In FIG. 14, the evaporation preventing layer is grown at approximately 700° C., which is higher than the growth temperature of approximately 630° C. for the active layer with strained layer quantum well and lower than the growth temperature of approximately 800° C. for the upper cladding layer. In FIG. 15, the evaporation preventing layer is grown at approximately 630° C. which is substantially equal to the growth temperature of the active layer with stained layer quantum well.

(6) The p-type (Mg-doped) $Al_{0.8}Ga_{0.2}As$ upper cladding layer 17 is grown to have a thickness of approximately 1.4 μm.

(7) The p-type (Zn-doped) GaAs cap layer 19 is grown to have a thickness of approximately 1 μm.

The wafer goes through the steps above and is subjected to photolithography and wet etching, the techniques of which are widely known, to form a Ridge waveguide structure having a width of 3 μm shown in FIG. 11. The p-type and n-type electrodes are formed at the wafer where Ridge waveguide structure is formed, and completed as a device.

Fifth Embodiment

The structure of the stacked layers of the compound semiconductor light emitting device formed in accordance with the fifth embodiment is identical to that in the compound semiconductor light emitting device in the first embodiment shown in FIGS. 1 and 8, and therefore description thereof will be not repeated. The fifth embodiment is characterized in that $Al_{0.4}Ga_{0.6}N$ is used as a material for forming the evaporation preventing layer. As a result, a clear difference is made in chemical composition of the materials between the evaporation preventing layer and the upper cladding layer to facilitate observation of the evaporation preventing layer after the device is manufactured.

The compound semiconductor light emitting device according to the present embodiment is manufactured by MOCVD method and sapphire (0001) c-face is employed as a substrate. Trimethylgallium (TMG), Trimethylaluminum (TMA) and trimetylindium (TMI) are used as the group III source gases, and ammonia ($NH_3$) is used as the group V source gas. Monosilane ($SiH_4$) is used as n-type dopant source, biscyclo-pentadienyl-magnesium ($Cp_2Mg$) is used as p-type dopant source, and $H_2$ is used as carrier gas.

The compound semiconductor light emitting device according to the present embodiment is formed by the steps below.

(1) The sapphire substrate is introduced into an MOCVD system and heated in $H_2$ at the substrate temperature of approximately 1050° C. to process the surface of the substrate.

(2) The substrate temperature is decreased to approximately 500° C. to grow the GaN or AlN buffer layer. Here, the thickness of the buffer layer is 250 Å if it is formed of GaN, or 500 Å if it is formed of AlN.

(3) The substrate temperature is elevated to approximately 1020° C. to grow the n-type GaN layer to have a thickness of approximately 4 μm.

(4) At the same substrate temperature, the n-type $Al_{0.1}Ga_{0.9}N$ lower cladding layer is grown to have a thickness of approximately 1 μm.

(5) The substrate temperature is decreased to approximately 800° C. and the non-doped or Si-doped $In_{0.2}Ga_{0.8}N$ active layer (or referred to as a light emitting layer) is grown to have a thickness of approximately 200 Å.

(6) The thin p-type layer of $Al_{0.4}Ga_{0.6}N$ for preventing evaporation is grown. The substrate temperature at this stage can be selected as desired in a range between approximately 600° C. and approximately 900° C. For example, the temperatures of approximately 600° C., approximately 800° C., approximately 900° C. can be selected.

(7) The substrate temperature is increased to approximately 1020° C. to grow the p-type $Al_{0.1}Ga_{0.9}N$ upper cladding layer to have a thickness of approximately 1 μm.

(8) The p-type GaN cap layer is grown to have a thickness of approximately 1 μm. The thin p-type layer of $Al_{0.4}Ga_{0.6}N$ for preventing evaporation becomes a high quality film while the substrate temperature is increased to approximately 1020° C.

The wafer at which the layers are thus formed is subjected to thermal annealing in $N_2$ at the temperature of approximately 700° C. By thermal annealing, the thin p-type layer for preventing evaporation, the p-type $Al_{0.1}Ga_{0.9}N$ upper cladding layer, and the p-type GaN cap layer change into high concentration p-type layers.

In order to form the n-type electrode, etching is performed until the n-type GaN layer is exposed. The p-type and n-type electrodes are formed on the etched wafer.

Although MOCVD method is employed for growth of crystal in the embodiments described above, such method as MBE method (molecular beam epitaxial growth method) can be used as the growth method. Various changes can be made to the material used and the growth conditions within the scope of the appended claims.

Although sapphire (0001) c-face is used as the substrate in the first through third and the fifth embodiments, SiC, MgO, ZnO, $MgAl_2O_4$, or the like can be used as a substrate.

In addition, as a buffer layer, the material with chemical formula $Al_xGa_{1-x}N$ (0<X<1) or the like can be used.

As an active layer, any material with chemical formula $Al_xGa_yIn_zN$ (X+Y+Z=1, $0 \leq X \cdot Y \leq 1$, and $0 < Z \leq 1$) can be used.

As a lower cladding layer, the material formed of n-type $Al_zGa_{1-z}N$ ($0 \leq Z \leq 1$) can be used, and as an upper cladding layer the material formed of p-type $Al_zGa_{1-z}N$ ($0 \leq Z \leq 1$) can be used.

The material formed of non-doped $Al_xGa_{1-x}As$ ($0 \leq X \leq 1$) can be used as a material for forming non-doped type GaAs layer 14 in the fourth embodiment. Non-doped $In_yGa_{1-y}As$ ($0 < y \leq 1$) can be used as a material for forming the non-doped $In_{0.15}Ga_{0.85}As$ active layer with strained quantum well. In addition, the material formed of p-type $Al_xGa_{1-x}As$ ($0 \leq X \leq 1$) can be used as the evaporation preventing layer in the fourth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A compound semiconductor light emitting device, comprising:

a substrate;

a lower cladding layer formed on said substrate;

an active layer including indium formed on said lower cladding layer;

an evaporation preventing layer formed on said active layer; and an upper cladding layer formed on said evaporation preventing layer, wherein said evaporation preventing layer includes $Al_{0.4}Ga_{0.6}N$.

2. The compound semiconductor light emitting device according to claim 1, further comprising a buffer layer formed between said substrate and said lower cladding layer.

3. The compound semiconductor light emitting device according to claim 1, further comprising a cap layer formed on said upper cladding layer.

4. The compound semiconductor light emitting device according to claim 1, wherein said active layer includes an active layer with strained layer quantum well.

5. The compound semiconductor light emitting device according to claim 4, wherein said device is provided with a Ridge waveguide structure.

* * * * *